United States Patent
Lill et al.

(10) Patent No.: US 6,518,190 B1
(45) Date of Patent: *Feb. 11, 2003

(54) PLASMA REACTOR WITH DRY CLEAN APPARATUS AND METHOD

(75) Inventors: Thorsten Lill, Sunnyvale, CA (US); Jeffrey D. Chinn, Foster City, CA (US)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/470,560

(22) Filed: Dec. 23, 1999

(51) Int. Cl.$^7$ .......................... H01L 21/00; H05H 1/00; C23C 16/00
(52) U.S. Cl. .............. 438/710; 156/345.48; 118/723 I; 134/1.1
(58) Field of Search .................. 156/345.48; 118/723 I, 118/723 AN, 723 IR; 315/111.51, 111.21; 134/1.1, 1.2, 1.3; 438/706, 710, 707

(56) References Cited

U.S. PATENT DOCUMENTS

| | | | |
|---|---|---|---|
| 5,423,945 A | | 6/1995 | Marks et al. |
| 5,514,246 A | | 5/1996 | Blalock |
| 5,585,012 A | | 12/1996 | Wu et al. |
| 5,753,044 A | | 5/1998 | Hanawa et al. |
| 5,795,429 A | * | 8/1998 | Ishii et al. .................. 156/345 |
| 5,817,534 A | | 10/1998 | Ye et al. |
| 5,879,575 A | | 3/1999 | Tepman et al. |
| 5,935,373 A | * | 8/1999 | Koshimizu .................. 156/345 |
| 6,016,131 A | * | 1/2000 | Sato et al. .................. 343/895 |
| 6,054,013 A | * | 4/2000 | Collins et al. .............. 156/345 |
| 6,063,233 A | * | 5/2000 | Collins et al. .............. 146/345 |

FOREIGN PATENT DOCUMENTS

EP    0 680 072 A    11/1995

OTHER PUBLICATIONS

Patent Abstracts of Japan, Publication No. 08124903, May 17, 1996 (Hitachi LTD).
Patent Abstracts of Japan, Publication No. 10302997, Nov. 13, 1998 (Anvela Corp).
Patent Abstracts of Japan, Publication No. 20001124200, Apr. 28, 2000 (Hitachi LTD).
U.S. application Ser. No. 08/648,254, filed May 13, 1996 entitled, "Inductively Coupled Plasmas Reactor Having an Overhead Solenoidal Antenna," By Kenneth Collins, et al.

* cited by examiner

*Primary Examiner*—Gregory Mills
*Assistant Examiner*—P. Hassanzadeh
(74) *Attorney, Agent, or Firm*—Robert M. Wallace; Joseph Bach

(57) ABSTRACT

A preferred embodiment of the plasma reactor of the present invention provides a chamber adapted to process a workpiece having at least one wall capable of allowing inductive power coupling into the reactor chamber. A source power antenna, capable of generating a processing plasma, confronts a portion of the at least one wall. A dry clean antenna is located adjacent the chamber beside a portion of the at least one wall not confronted by the source power antenna. During workpiece processing, the dry clean antenna preferably has essentially a floating potential. After workpiece processing has ceased, a dry clean plasma may be generated by inductive coupling using the dry clean antenna. Embodiments of the present invention allow dry clean plasma characteristics to be optimized to improve dry clean effectiveness. The source power antenna also may couple power to the dry clean plasma, preferably in parallel with the dry clean antenna. With such embodiments, the source power antenna may be operated so that it couples less power to the dry clean plasma, while the dry clean antenna couples more. This allows sputtering of the chamber wall under the source power antenna to be reduced and allows more effective removal of accumulated deposits.

3 Claims, 4 Drawing Sheets

PLASMA REACTOR WITH DRY CLEAN APPARATUS AND METHOD

BACKGROUND

Inductively coupled plasma reactors are used in processing semiconductor wafers or other workpieces. Inductively coupled plasma reactors are currently used to perform various processes on semiconductor wafers including metal etching, dielectric etching, and chemical vapor deposition, for example. In an etch process, one advantage of an inductively coupled plasma is that a high density plasma ion density is provided to permit a large etch rate with a minimal plasma D.C. bias, thereby permitting more control of the plasma D.C. bias to reduce device damage. For this purpose, the source power applied to the antenna and the DC bias power applied to the wafer pedestal are separately controlled RF supplies. Separating the bias and source power supplies facilitates independent control of ion density and ion energy, in accordance with well-known techniques. Typically, to produce an inductively coupled plasma, the inductive antenna is provided outside the reactor chamber adjacent a wall or walls capable of allowing inductive power coupling into the reactor chamber. The inductive antenna provides the RF power which ignites and sustains the plasma.

One characteristic of such a plasma reactor is that the spatial distribution of the plasma ion density across the wafer surface is critical to uniform processing across the workpiece. In a metal etch process, for example, because the etch rate is affected by plasma ion density, non-uniform plasma ion density across the workpiece results in non-uniform etch rate across the wafer. As a result, the etch process is difficult to control and may over-etch devices on some portions of the wafer and under-etch devices on other portions of the wafer, leading to reduced production yield.

Hence, the spatial distribution of the plasma ion density within the chamber must be precisely controlled to optimize processing. The geometry and placement of the inductive antenna along with the shape of the reactor chamber in large part determines the spatial distribution of the plasma ion density within the reactor chamber. Thus, antenna and chamber arrangement are optimized to ensure plasma uniformity across the workpiece.

To accomplish this, the antenna typically is placed adjacent only a portion of a chamber wall. This necessarily results in uneven power coupling through different portions of the chamber walls, producing areas of high and low coupling through the reactor walls. FIG. 1A illustrates one reactor configuration optimized to provide plasma uniformity across the workpiece in accordance with U.S. Pat. No. 5,753,044, by Hanawa et al., entitled RF PLASMA REACTOR WITH HYBRID CONDUCTOR AND MULTI-RADIUS DOME CEILING, issued on May 19, 1998, herein incorporated by reference in its entirety. With this configuration, a coil antenna 20 may be located adjacent a portion of a multi radius dome-type top wall 110 of reactor 100 to provide uniform processing across a workpiece 30. In such a reactor, the top wall 100 may be formed of a dielectric material such as aluminum oxide, quartz; ceramic, or other material capable of coupling inductive power.

One problem with such reactors is that the fabrication process leaves deposits on the reactor chamber surfaces. These deposits can contaminate the process environment and reduce yields. This particularly is true as the size of the devices fabricated on the workpiece are reduced. Thus, these deposits periodically must be removed to provide acceptable process yields.

One method of removing contaminates is to dry clean the chamber using a plasma. This may be done simultaneously with workpiece processing as disclosed in U.S. Pat. No. 5,817,534, by Ye et al., issued Oct. 6, 1998, entitled RF PLASMA REACTOR WITH CLEANING ELECTRODE FOR CLEANING DURING PROCESSING OF SEMICONDUCTOR WAFERS; and in U.S. Pat. No. 5,879,575, by Tepman et al., issued Mar. 9, 1999, entitled SELF-CLEANING PLASMA PROCESSING REACTOR; or by generating dry clean plasma after workpiece processing is complete as disclosed in U.S. Pat. No. 5,514,246, by Blalock, issued May 7, 1996, entitled PLASMA REACTORS AND METHOD OF CLEANING A PLASMA REACTOR; all herein incorporated by reference in their entireties. In implementation, however, these solutions do not always allow the desired optimization of plasma uniformity across the workpiece.

Another problem which can occur in reactors optimized for plasma uniformity across the workpiece is that, due to the uneven power coupling through different portions of the chamber walls, deposits can form non-uniformly across the interior surface of the chamber wall. For example, FIG. 1B shows a typical distribution of deposits on the interior surface 10 of the top wall 110 for the reactor configuration of FIG. 1A. More deposits form on portions 10a & 10c of the interior surface 10 of the top wall 110 where the antenna coil does not confront the chamber than where it does. Further, under most operating parameters, no deposits will form on the portion 10b of interior surface corresponding to location of the coil antenna 20 (shown in FIG. 1A).

In such instances observed by the present inventors, generating a dry clean plasma using the source power coil can cause undesirable results. For example, the dry clean plasma cleans most efficiently opposite the coil antenna, the location with the least amount of deposits. Further, because inductive coil antennas also couple a small amount of capacitive power, the portion 10b of the interior surface opposite the antenna may sputter during the cleaning process. In some dry cleaning processes sputtering and subsequent redeposition of top wall 110 material can significantly inhibit, or even prevent dry cleaning of some deposits. For example, using a fluorine based plasma to dry clean an aluminum oxide wall can lead to aluminum fluoride deposits over portions 10a & 10c. The deposited aluminum fluoride forms a sandwich structure with the existing deposits thereon, which inhibits their removal and can lead to flaking of the sandwich structure.

Thus, what is needed is a reactor that is both optimized to ensure plasma uniformity across the workpiece, and capable of providing more efficient cleaning of reactor chamber surfaces.

SUMMARY

In an embodiment of the plasma reactor of the present invention, a chamber adapted to process a workpiece having at least one wall capable of allowing inductive power coupling into the reactor chamber is provided. A source power antenna, capable of generating a processing plasma, confronts a portion of the at least one wall. A dry clean antenna is located adjacent the chamber beside a portion of the at least one wall not confronted by the source power antenna.

In the preferred method of the present invention, the source power antenna generates a processing plasma for processing a workpiece. During workpiece processing, the dry clean antenna does not substantially interfere with uniformity of a processing plasma across the workpiece. In preferred embodiments, the dry clean antenna is provided with essentially a floating potential. As such, in more preferred embodiments, the dry clean antenna does not have any voltage applied, but instead is allowed to float so as not to significantly interfere with coupling of source power provided by the source power antenna. After workpiece processing has ceased, a dry clean plasma may be generated by inductive coupling using the dry clean antenna.

The reactor configurations of some more preferred embodiments allow dry clean power to couple into the chamber away from the source power antenna, where greater amounts of deposits typically accumulate. Some embodiments of the present invention may provide increased cleaning plasma density more remote from the source power antenna. This allows for improved cleaning of not only remote portions of the inductive coupling wall of the reactor, but also provide improved cleaning of other remote regions, such as the pumping apparatus and its associated components, for example. Further, the reactor configuration of some more preferred embodiments allow less power to be coupled near portions with less accumulation. As such, embodiments of the present invention allow optimization of the dry clean plasma to improve dry clean effectiveness.

In some embodiments, the source power antenna also may couple power to the dry clean plasma, preferably in parallel with the dry clean antenna. With such embodiments, the source power antenna may be operated so that it couples less power to the dry clean plasma. As such, sputtering of the chamber wall under the source power antenna can be inhibited, thus both reducing the flaking of deposits caused by chamber wall contaminates during the cleaning process, and improving the longevity of the chamber wall.

In one of the preferred embodiments, an inductive coil source power antenna is disposed over a reactor with a multi-radius dome top wall. The source power coil antenna is located adjacent a portion of the top wall and a dry clean coil antenna is nested within the source power coil antenna. A switching circuit may be employed to couple RF power in the form of processing plasma source power to the source power antenna, while allowing a floating potential for the dry clean antenna, during workpiece processing. Also, it may couple RF power in the form of dry clean power to the dry clean antenna, as well as, the source power antenna during the dry clean process.

DESCRIPTION OF THE PREFERRED EMBODIMENTS AND METHODS OF THE PRESENT INVENTION

Figure 1A:
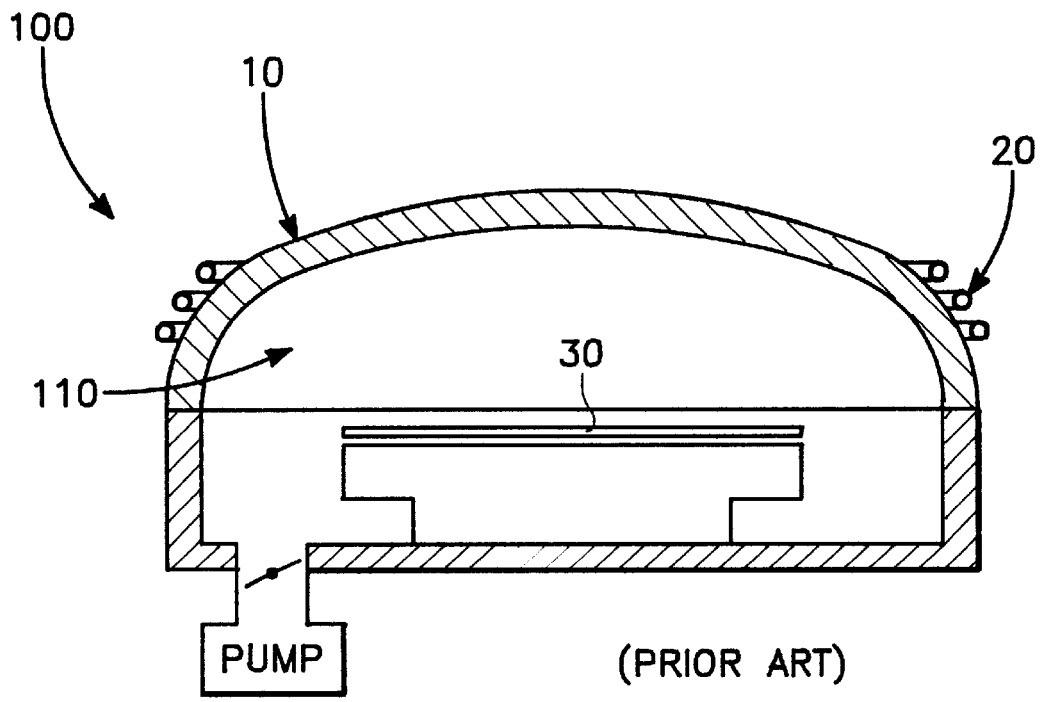
FIG. 1A illustrates a cut away side view of a prior art reactor configuration optimized to provide uniform plasma processing across a workpiece.
Figure 1B:
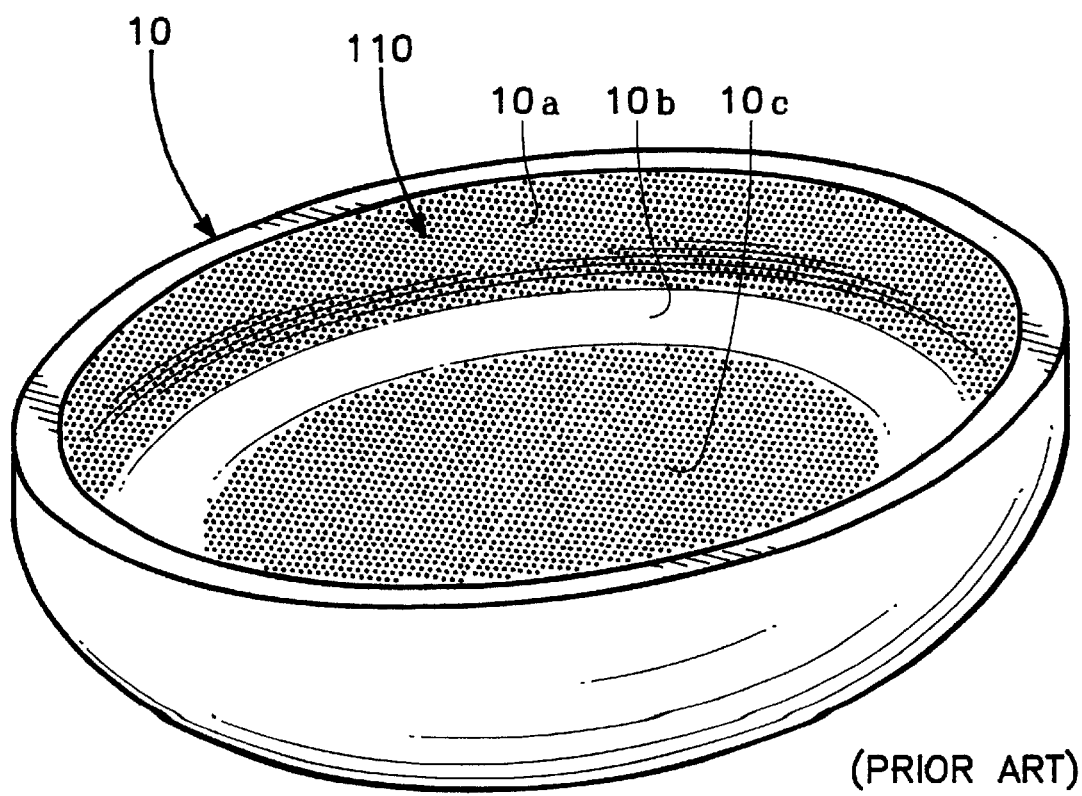
FIG. 1B is an isometric view of the top wall of the reactor of FIG. 1A illustrating accumulation of deposits on the interior surface of the top wall.
Figure 2A:
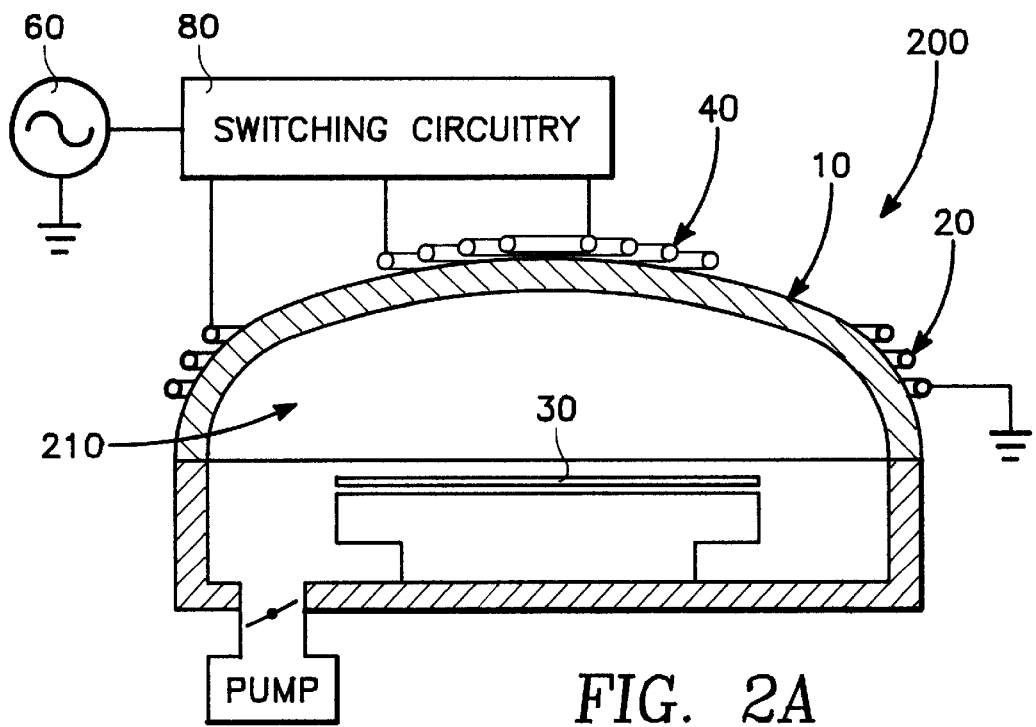
FIG. 2A is a cut away side view of a possible embodiment in accordance with the present invention.

FIG. 2A illustrates an embodiment of an inductively coupled plasma reactor 200 of the present invention. A source power coil antenna 20 is located adjacent a top wall 10 of the reactor chamber 210 to couple RF power to the chamber 110. The source power antenna 20 and the top wall 10 are arranged to provide a processing plasma optimized to ensure a desired plasma uniformity across a workpiece 30. In this embodiment, the source power antenna 20 is adjacent only an annular portion of a multi-radius dome-shaped top wall 10 which is capable of coupling inductive power in the chamber 210. An inductive dry clean coil antenna 40 confronts the top wall 10 adjacent the source power antenna 20.

In the preferred embodiment and method of the present invention, the dry clean antenna 40 does not couple inductive power to the processing plasma during workpiece 30 processing. Instead, the dry clean coil 40 is allowed to float during workpiece 30 processing so as to not interfere significantly with RF source power coupling to the processing plasma, thus allowing processing uniformity across the workpiece to be maintained.

In the embodiment of FIG. 2A, the dry clean antenna 40 is coupled to an RF power source 60 via switching circuitry 80. The switching circuitry 80 is capable of providing RF power to the source power antenna 20 and to the dry clean antenna 40. It also may provide a ground or return for the dry clean antenna 40 during dry clean processes. In some embodiments, separate RF power sources (not shown) may provide RF power to each of the source power antenna 20 and the dry clean antenna 40. In such an embodiment, as in single RF power source embodiments, the dry clean antenna 40 does not supply inductive power to the processing plasma during workpiece 30 processing. Instead, the switching circuitry 80 provides the dry clean coil 40 with a floating potential during workpiece 30 processing. Thus, in more preferred embodiments and methods, the dry clean antenna 40 only is powered during dry clean plasma generation after the workpiece has been processed and removed from the processing chamber. As such, in preferred embodiments, the dry clean antenna 40 does not substantially interfere with uniformity of the processing plasma across the workpiece.

Figure 2B:
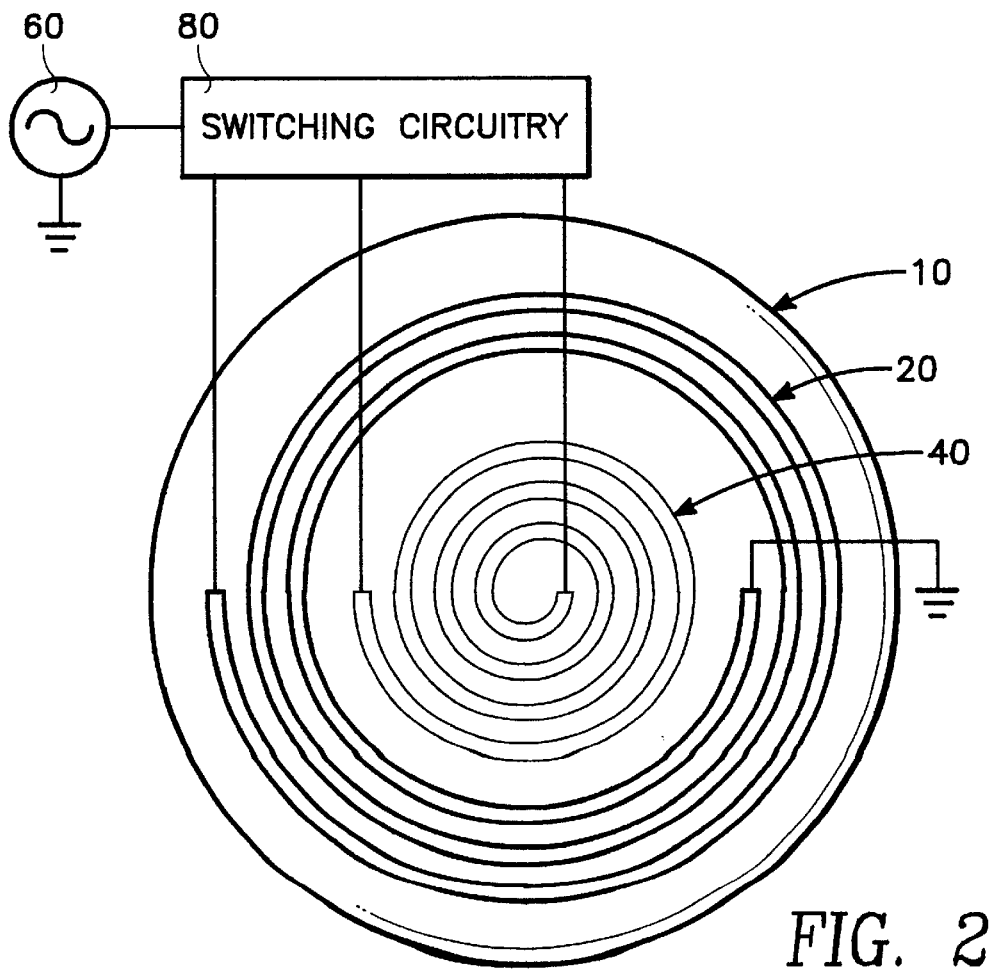
FIG. 2B is a top view of the reactor of FIG. 2A.

FIG. 2B shows a top view of the embodiment of FIG. 2A. In this embodiment, the dry clean coil antenna 40 is located beside the source power antenna 20 adjacent the top wall 10. The top wall 10 may comprise any known material capable of coupling inductive power into the reactor chamber 210, such as but not limited to aluminum oxide, quartz, ceramic, silicon, carbon, or the like, or other material known to couple inductive power.

The dry clean antenna, although depicted as a single concentrically nested dry clean coil 40 in this embodiment, may have other configurations. For example, one or more a non-concentric windings, or, one or more non-nested windings are possible. To optimize cleaning effectiveness, the dry clean antenna can be disposed so as to couple power through chamber walls where greater amounts of deposits accumulate. As such, some embodiments of the present invention have the dry clean antenna located adjacent some, or all of the chamber walls capable of coupling inductive power which are not confronted by the inductive source power antenna 20. Further, embodiments of the present invention can provide one or more inductive dry clean antennas adjacent a contiguous portion, or isolated portions, of such chamber walls.

Figure 3:
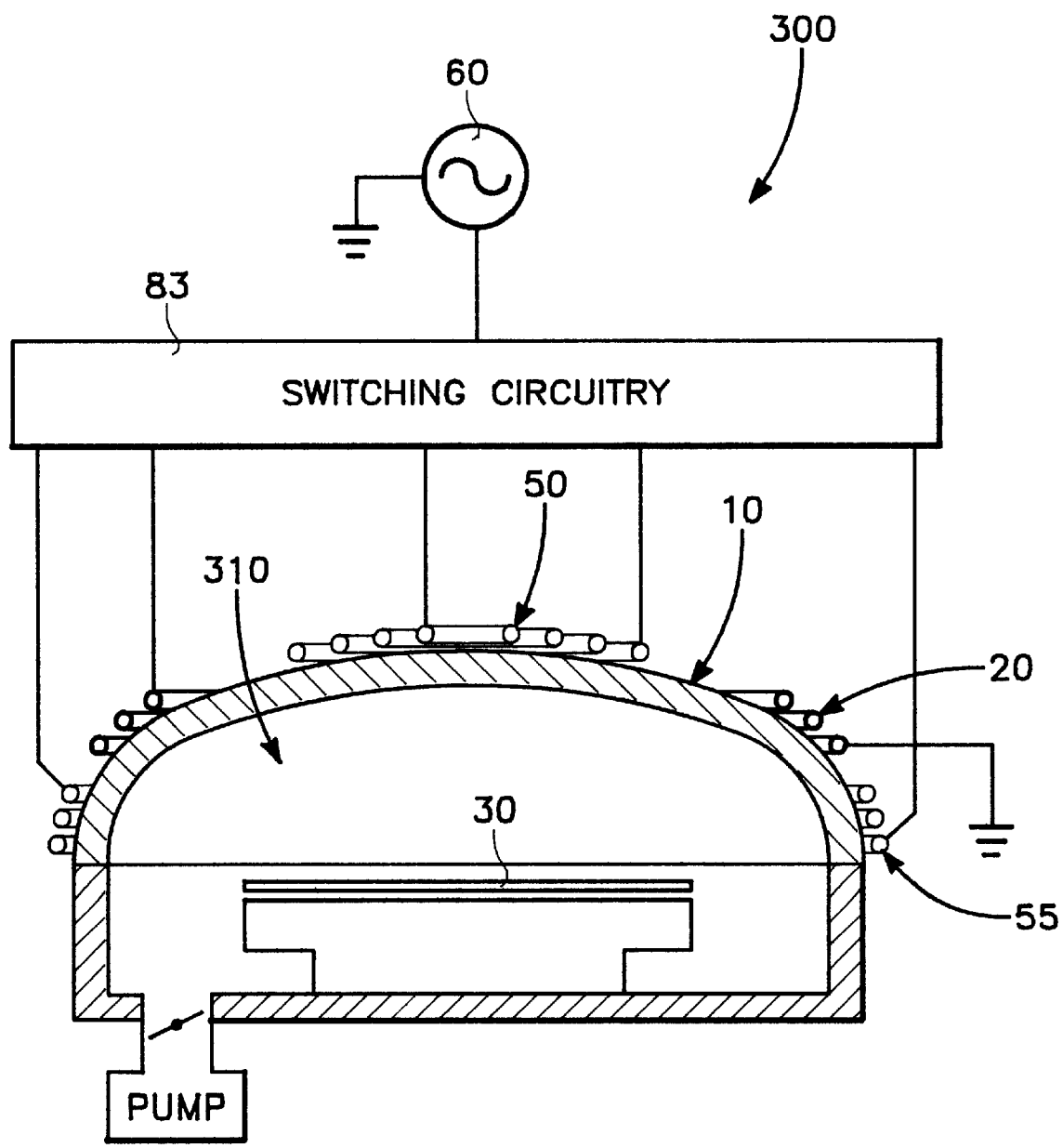
FIG. 3 is a cut away side view of a possible embodiment in accordance with the present invention.

FIG. 3 shows a reactor having multiple dry clean coil antennas 50 and 55. In this embodiment, the turns of dry clean antenna 50 are located within the innermost turn of the source power antenna 20 and adjacent the top wall 10 of reactor 300. The turns of dry clean antenna 55 are located outside the source power antenna and adjacent the top wall 10 of the reactor 300. The dry clean coil antennas 50 and 55 may be operated together, or independently. As such, an RF source 60, or multiple RF sources (not shown), may be coupled through switching circuitry 83 to provide dry cleaning power to the dry clean antennas 50 and 55, and to the source power antenna 20. As discussed above, in the preferred embodiment, the dry clean antennas 50 and 55 do not supply inductive power to the processing plasma during workpiece 30 processing. Instead, they have a floating potential during workpiece 30 processing, which may be provided by one or more switching circuits.

Figure 4:
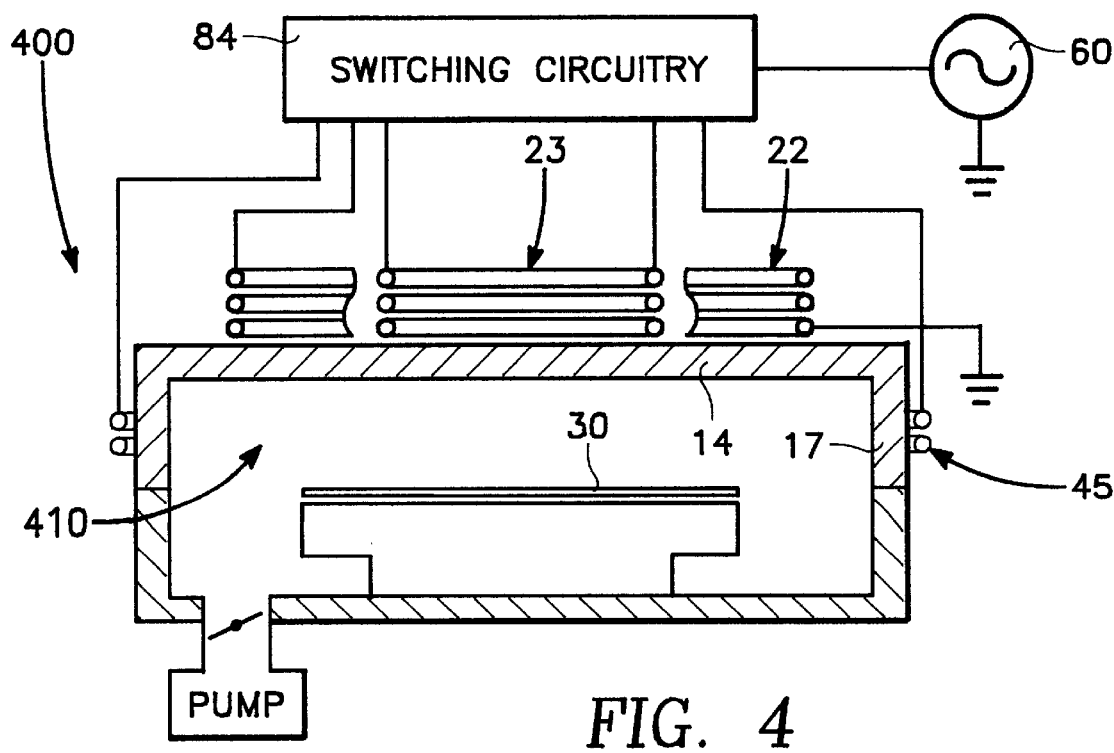
FIG. 4 is a cut away side view of a possible embodiment in accordance with the present invention.
Figure 5:
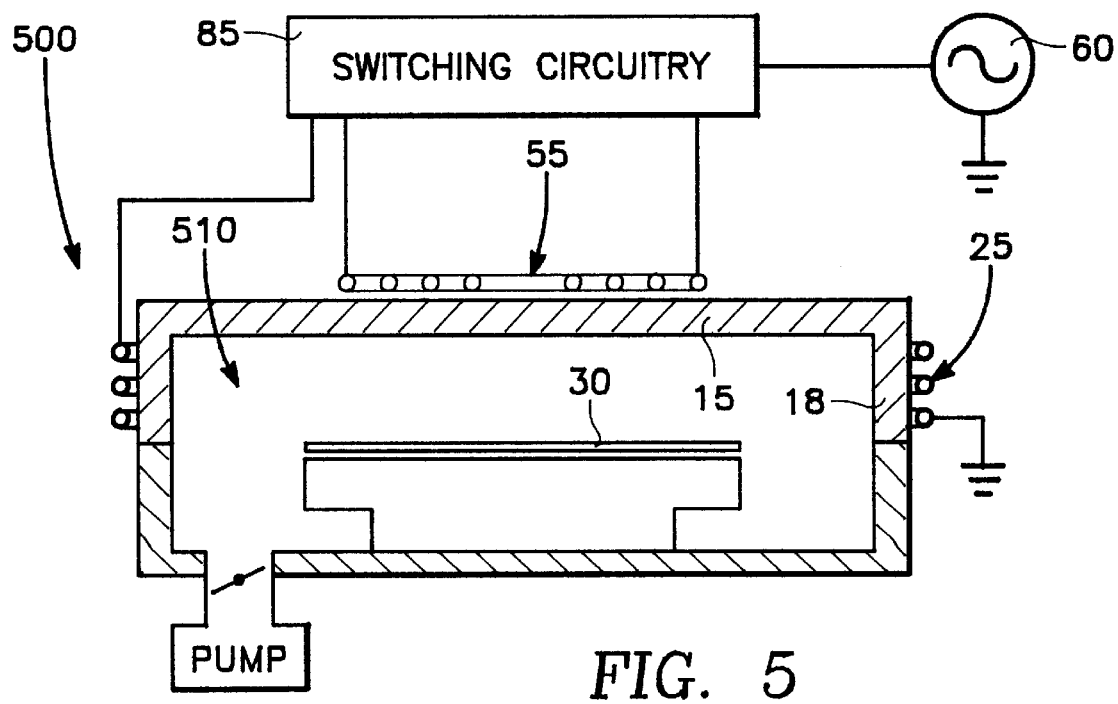
FIG. 5 is a cut away side view of a possible embodiment in accordances with the present invention.

Embodiments of the present invention are not limited to a specific reactor configuration, as different possible reactor chamber and antenna configurations may be utilized to optimize plasma processing of a workpiece. Embodiments of the present invention may have any known reactor configuration. For example, FIG. 4 shows a possible embodiment having a flat top wall 14 with solenoidal type source power antenna coils 22 and 23 located over the top wall 14 in accordance with U.S. Patent Ser. No. 08/648,254, by Collins et al., filed on May 13, 1996, entitled INDUCTIVELY COUPLED RF PLASMA REACTOR HAVING AN OVERHEAD SOLENOIDAL ANTENNA, issued as U.S. Pat. No. 6,165,311, on Dec.20, 2000, herein incorporated by reference in its entirety. In this embodiment, the dry clean antenna coil 45 may be disposed around a portion of the side wall 17 of reactor 400, or adjacent other portions of the chamber walls not occupied by the source power antenna. As another non-exclusive example, FIG. 5 shows a possible embodiment having a flat top wall 15 with a source power inductive coil antenna 25 disposed around a sidewall portion of the reactor 500. A dry clean inductive coil antenna 55 confronts the top wall 15 of the reactor 500.

As such, embodiments of the present invention may provide one or more inductive antennas adjacent a portion, or portions of the chamber not confronted by the inductive source power antenna to optimize power coupling into the chamber to improve dry clean characteristics. Further, it is not necessary that the dry clean coil be concentrically located with respect to the source power antenna. Any known inductive antenna configuration may be used as the dry clean antenna in embodiments of the present invention. For example, the dry clean antenna may be segmented and independently controlled, or it may have a plurality of separate antenna windings, which may conform or not conform with the reactor wall.

During dry clean processes, the dry clean antenna or antennas may be operated alone, or along with, the source power antenna then generate the dry clean plasma. Preferably, the dry clean antenna is operated in parallel with source power antenna to generate the dry clean plasma, although it is possible in some embodiments to provide a series coupling of the dry clean and source power antennas.

In more preferred embodiments, dry clean RF power characteristics and antenna configuration are tailored so that more power is coupled into the chamber where greater deposition accumulation exists, while less is coupled near portions with less accumulation. As a general example, during a dry clean process in the embodiment of FIG. 3, the dry clean antennas 50 and 55 may be supplied with greater RF power than the source power antenna 20. This will remove accumulation that normally deposits away from the location of source power antenna 20. Moreover, it allows the source power antenna 20 to be maintained below a level sufficient to inhibit sputtering of the top wall 10 under the source power antenna 20. For example, the dry clean coil 40 could be operated at about 800W–1000W, while the source power coil antenna 20 could be operated at about 200W–400W. These values are exemplary an depend on the particular process application. Further, it is also possible to drive the dry clean antenna 40 and the source power antenna 20 at the same, or at different frequencies during dry clean to control dry clean plasma characteristics.

Furthermore, it is possible to supply different power levels and/or frequencies to each dry clean antenna 50 and 55, or to different segments or turns of dry clean antennas 50 and 55. As such, removal of deposition may be tailored depending on chamber configuration and deposition accumulation characteristics within the chamber. Thus, embodiments of the present invention allow optimization of dry clean power coupling into the reactor chamber to improve dry clean plasma characteristics.

As a result of locating the dry clean antenna adjacent areas not confronted by the source power antenna and coupling more power therethrough, the duration of dry clean processes may be reduced, allowing increased reactor utilization for workpiece processing. Further, it allows control of unwanted sputtering of the reactor wall under the source power antenna. As such, reactor wall sputtering may be reduced or eliminated.

In addition, in some applications, the inductive dry clean coil antenna also may provide a sputtering component which may enhance cleaning of deposits under the dry clean antenna. Moreover, redeposition during the dry clean process now can be inhibited on the portions of the interior chamber walls having greater accumulation of deposits. Hence, flaking caused by further accumulation of deposits during the dry clean process, such as, for example, an aluminum fluoride deposit generated in a fluorine based plasma dry clean of an aluminum oxide wall, can be eliminated. As an added advantage, reducing the amount of sputtering of the exposed portions of the wall during the dry clean process can increase the longevity of the wall.

Furthermore, because the present invention provides a plasma process for dry cleaning, it provides more flexibility to clean various types of deposits than do chemical type processes. In the case of an etch reactor, or example, etching of a large number of different materials can lead to a greatly varied composition of deposits on the interior surfaces of the reactor chamber. Such deposits can be difficult to remove by chemical type processes. As such, the present invention allows cleaning of a wider range of different deposits. Further, the present invention, may be utilized in conjunction with reactors utilizing other dry cleaning apparatuses, such as, for example, a downstream type plasma cleaning apparatus, which may provide chemical type cleaning, or with other known chemical process apparatus.

An additional advantage of the present invention is that the dry clean plasma generated by inductive coupling can provide increased plasma density adjacent regions more remote from the source power antenna. As such, some embodiments of the present invention provide improved cleaning of not only remote portions of the inductive coupling wall of the reactor, but also provide improved cleaning of more remote regions, such as the pumping apparatus and its associated components, for example.

While the preferred embodiments and methods of the present invention have been described in detail above, many changes to these embodiments may be made without departing from the true scope and teachings of the present invention. For example, one of many possible changes not presently preferred is to provide the dry clean antenna with a small DC potential which is allowed to float in response to RF source power. Another possibility, not presently preferred, is to supply only an insignificant amount of RF power to the dry clean antenna. In these ways, as with the more preferred embodiments, the dry clean antenna would not substantially interfere with plasma uniformity during workpiece processing.

The present invention, therefore, is limited only as claimed below and the equivalents thereof.

We claim:

1. A method of cleaning a plasma reactor and processing a wafer in the plasma reactor, the reactor having a ceiling supported on a side wall of said reactor and overlying a wafer support pedestal of the reactor, said method comprising:

providing a processing coil antenna overlying only an annular portion of said ceiling;

providing a cleaning coil antenna overlying at least an other portion of said ceiling outside of said annular portion;

during wafer processing, setting a wafer on said wafer support pedestal so as to face said ceiling and applying plasma RF source power to said processing coil antenna while maintaining said cleaning antenna at a selected potential that is compatible with said processing coil antenna providing an adequately uniform plasma density distribution over said wafer, said plasma RF source power being sufficient for radiation from said processing coil antenna to cause an interior surface of said annular portion to remain free of contaminant deposition and being insufficient for said radiation to cause an interior surface of said other portion to remain free of contaminant deposition, whereby at least a part of the interior surface of said other portion of said ceiling accumulates contaminant deposition during said wafer processing;

after wafer processing, removing said wafer from said wafer support pedestal, and removing said contaminant deposition from said other portion by applying RF cleaning power to said cleaning coil antenna, said RF cleaning power being sufficient for radiation from said cleaning antenna to cause removal of said contaminant deposition from the interior surface of said other portion of said ceiling.

2. The method of claim 1 wherein said selected potential of said cleaning antenna during wafer processing is a floating potential.

3. The method of claim 1 wherein said RF source power is sufficiently limited to avoid damage of microelectronic structures formed on said wafer while said RF cleaning power is greater than said RE source power, whereby to efficiently sputter contaminant deposition from said other portion of said ceiling.

* * * * *